United States Patent
Kinoshita et al.

(10) Patent No.: US 9,033,776 B2
(45) Date of Patent: May 19, 2015

(54) AIR CONDITIONING APPARATUS AND AIR CONDITIONING SYSTEM

(75) Inventors: Tomoyuki Kinoshita, Yokohama (JP); Yuuichi Hanada, Saitama (JP); Hideyoshi Ootani, Chiba (JP); Yasuo Takagi, Chigasaki (JP); Dai Murayama, Musashino (JP); Hiroshi Morimoto, Tokyo (JP); Koubun Takahashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 831 days.

(21) Appl. No.: 13/210,500

(22) Filed: Aug. 16, 2011

(65) Prior Publication Data
US 2011/0300789 A1    Dec. 8, 2011

Related U.S. Application Data

(63) Continuation of application No. PCT/JP2011/060732, filed on May 10, 2011.

(30) Foreign Application Priority Data

May 14, 2010 (JP) ................................ P2010-112548

(51) Int. Cl.
*H05K 7/20* (2006.01)
*F24F 11/00* (2006.01)

(52) U.S. Cl.
CPC ........ *H05K 7/20745* (2013.01); *F24F 11/0001* (2013.01); *F24F 11/0015* (2013.01); *F24F 2011/0002* (2013.01)

(58) Field of Classification Search
CPC ........... H05K 7/20745; F24F 2011/002; F24F 11/0001; F24F 11/0015
USPC .................. 454/184, 239, 251, 253
See application file for complete search history.

(56) References Cited

U.S. PATENT DOCUMENTS

2008/0185446 A1* 8/2008 Tozer ........................... 236/49.4
2009/0117843 A1* 5/2009 Palmer et al. ................. 454/239
2009/0265121 A1* 10/2009 Rocci et al. ..................... 702/57

FOREIGN PATENT DOCUMENTS

JP    11-83099    3/1999
JP    2002-48380    2/2002

(Continued)

OTHER PUBLICATIONS

First Office Action issued by the State Intellectual Property Office of the People's Republic of China on Nov. 5, 2013, for Chinese Patent Application No. 201180001095.3, and English-language translation thereof.

(Continued)

*Primary Examiner* — Gregory Huson
*Assistant Examiner* — Dana Tighe
(74) *Attorney, Agent, or Firm* — Finnegan, Henderson, Farabow, Garrett & Dunner, L.L.P.

(57) ABSTRACT

An embodiment includes a first space, a second space, a first damper, a second damper, and a third damper. The first space is connected to a cold space, having cold air reside therein to send to the cold space. The second space has return air reside therein, as it is discharged from a hot space. The first damper has an opening adjusted under control of a controller to take in outdoor air to the first space, and is operable to have an open state in an emergency with a server being supplied with power. The second damper has an opening adjusted under control of the controller to discharge return air in the second space, outside thereof, and is operable to have an open state in the emergency. The third damper has an opening adjusted under control of the controller to recirculate return air in the second space to the first space.

3 Claims, 1 Drawing Sheet

(56) References Cited

FOREIGN PATENT DOCUMENTS

| JP | 2002-61911 | 2/2002 |
|---|---|---|
| JP | 2002-277002 | 9/2002 |
| JP | 2004-125194 | 4/2004 |
| JP | 2008-143661 | 6/2008 |
| JP | 2010-2148 | 1/2010 |

OTHER PUBLICATIONS

Notice of Reasons for Refusal issued by the Japanese Patent Office on Dec. 10, 2013, for Japanese Patent Application No. 2010-112548, and English-language translation thereof.

International Search Report issued by the Japanese Patent Office on Aug. 16, 2011, for International Application No. PCT/JP2011/060732.

* cited by examiner

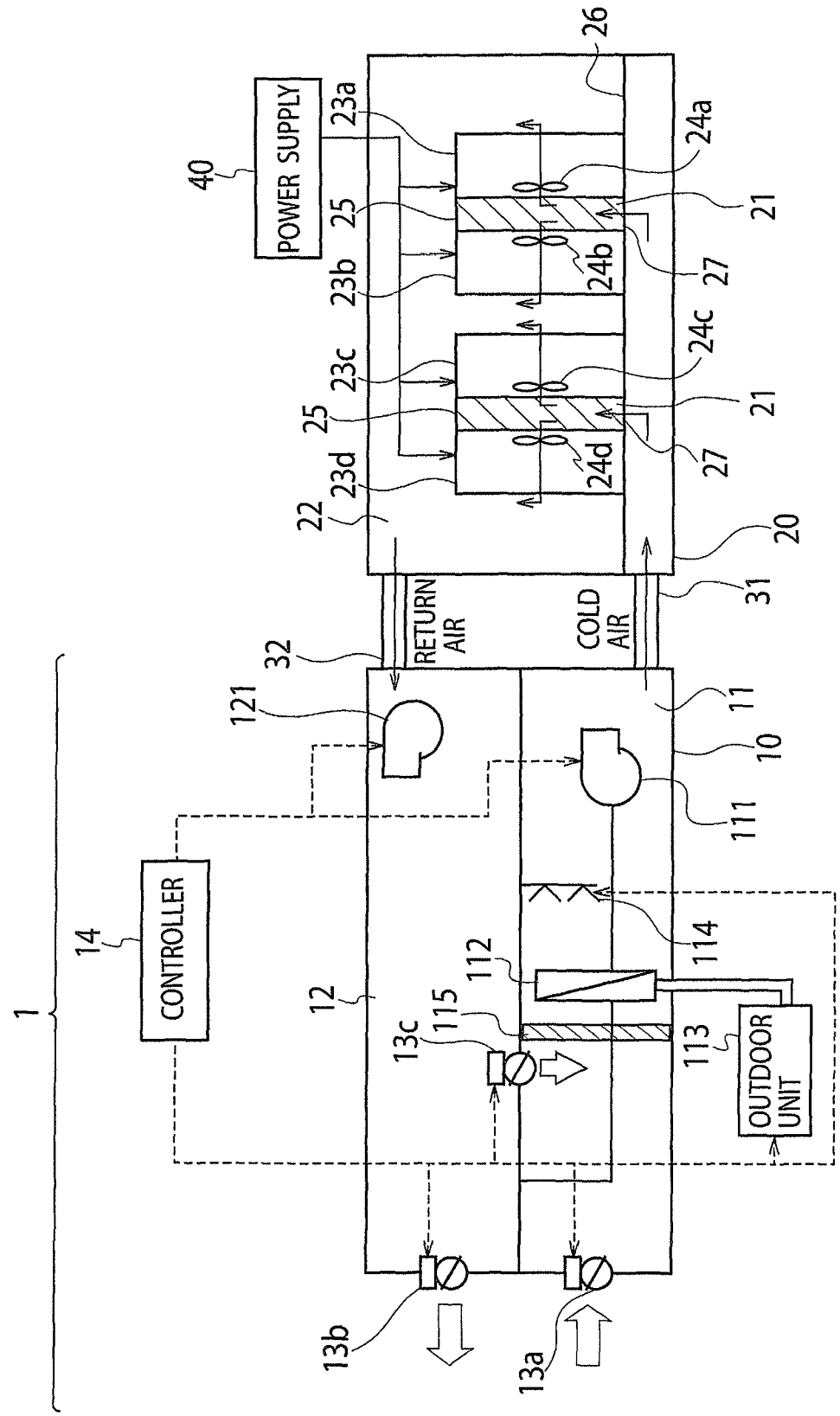

AIR CONDITIONING APPARATUS AND AIR CONDITIONING SYSTEM

CROSS-REFERENCE TO RELATED APPLICATION

This application is a Continuation of PCT Application No. PCT/JP2011/060732, filed on May 10, 2011, and claims the priority of Japanese Patent Application No. 2010-112548, filed on May 14, 2010, the content of both of which is incorporated herein by reference.

FIELD

Embodiments described herein relate generally to an air conditioning apparatus and an air conditioning system adapted for recirculation of air as necessary, even in emergencies such as interruption of power, to prevent failures at servers.

BACKGROUND

Using a room as a server room, there can be computing machines such as servers installed in the room. Providing the computing machines are servers, for instance, such the server room is referred to as a data center. Recent introduction of IT is accompanied by increase in number of such data centers, as well as increases in numbers of computing machines installed in data centers.

Such computing machines dissipate heat when working. As computing machines installed in a server room increase in number, the entire dissipation of heat in the server room increases, so there are advancing developments of air conditioning apparatuses, as well as cooler equipment for supplying cold air into a server room, thereby cooling computing machines.

On the other hand, at server rooms such as data centers, there is such a design as intended for use of a service of power from a commercial power source, and besides, for use of a service of power from an uninterruptible power supply (UPS) in emergencies such as power interruption including interruption of the service of power from the commercial power source. However, for air conditioning apparatuses used for cooling server rooms in the past, there was no consideration made of cooling a server room in such an emergency.

BRIEF DESCRIPTION OF THE DRAWINGS

FIG. 1 is a diagram of entirety of an air conditioning system according to a certain embodiment.

DETAILED DESCRIPTION

According to one embodiment, an air conditioning apparatus includes a first space, a second space, a first damper, a second damper, and a third damper. The first space is connected to a cold space, having cold air reside therein to send to the cold space. The second space has return air reside therein, as it is discharged from a hot space. The first damper has an opening adjusted under control of a controller to take in outdoor air to the first space, and is operable to have an open state in an emergency with a server being supplied with power. The second damper has an opening adjusted under control of the controller to discharge return air in the second space, outside thereof, and is operable to have an open state in the emergency. The third damper has an opening adjusted under control of the controller to recirculate return air in the second space to the first space.

There will be described air conditioning apparatuses and air conditioning systems according to some embodiments, with reference to the drawing. The air conditioning systems according to the embodiments work as a system connected to a server room having computing machines such as servers installed therein, and adapted to provide services for normal run of the computing machines, including sending cold air, cooling computing machines dissipating running heat.

FIG. 1 shows a server room 20 connected to an air conditioning system 1 according to a certain embodiment, the server room 20 having therein a combination of hot area or space 22 and cold areas or spaces 21 defined as different spaces. More specifically, the server room 20 is separated into a hot space 22 and a set of cold spaces 21, by provision of racks 23 (23a, 23b, 23c, 23d) with closure plates 25, the racks 23 serving for accommodation of a set of computing machines such as a set of servers (non-depicted).

There are fans 24 (24a, 24b, 24c, 24d) each provided to a rack 23 or for a server. The racks 23 as well as servers are each arranged for use of revolutions of a fan 24 to take in cold air residing in a cold space 21, cooling a server working with heat dissipation, to let out as heated return air to the hot space 22. In the example illustrated in FIG. 1, where the racks 23 are mounted on a floor 26 that is double floored for under floor distribution of cold air from air conditioner, for instance, there are arrays of openings 27 formed in the floor 26, each in position to supply cold air to a cold space 21 defined by and between racks arranged with their air intake sides opposing each other, so cold air is let into the racks 23, causing such streams of return air as outflowing to the hot space 22.

The air conditioning system 1 includes an air conditioning apparatus 10, and a controller 14. The air conditioning apparatus 10 is configured, as illustrated in FIG. 1, with a first area or space 11 and a second area or space 12 separated from each other, and has a first damper 13a operable for adjustment of the opening to intake ambient or outdoor air to the first space 11, a second damper 13b operable for adjustment of the opening to discharge return air in the second space 12, outside the air conditioning apparatus 10, and a third damper 13c operable for adjustment of the opening to send return air in the second space 12, to the first space 11. Here, the first space 11 is connected to the cold spaces 21 in the server room 20, by combination of an air supply duct 31, the double flooring for under floor service, and the arrays of openings 27 in the floor 26. Further, the hot space 22 in the server room 20 is connected to the second space 12, through an air return duct 32, allowing for configuration to produce a constant air flux from the first space 11 to the second space.

Further, in the air conditioning system 1, the first space 11 is equipped with an outdoor unit 113, a coil 112, a humidifier 114, and a first air blower 111, and the second space 12 is furnished with a second air blower 121. The outdoor unit 113 feeds a coolant for use to produce cold air at the coil 112. The coil 112 serves for cooling flux of air to provide cold air, as necessary. The humidifier 114 serves for humidifying flux of air, as necessary. The first air blower 111 is operable to blow cold air, to send to the cold spaces 21. The second air blower 121 is operable to run return air from the hot space 22, out of the air conditioning apparatus 10 or to the first space 11.

The air conditioning system 1, which is responsible for cooling servers in the server room 20, has to supply cold air from the first space 11 to the cold spaces 21 under prescribed temperature and humidity conditions. Namely, for use of the server room 20 as a data center, it is required to send such cold air as meeting those conditions (temperature: 18 to 27° C., absolute humidity: 0.0056 to 0.01071 Kg/Kg, relative humidity: 60% or less) specified by the American Society of Heating, Refrigeration, and Air Conditioning Engineers (ASHRAE). Here, the air conditioning system 1 is adapted for use of the controller 14 to control the air blowers 111 and 121, coil 112, outdoor unit 113, humidifier 114, and dampers 13a, 13b, and 13c, for controlling, among others, supply of cold air, efflux of return air, and the like. For such control services, the controller 14 is configured to operate in accordance with temperatures measured at temperature sensors (non-depicted).

For high outdoor temperatures with which the outdoor air is undesirable to use, for instance, the controller 14 operates to close the first damper 13a and the second damper 13b, and open the third damper 13c, causing recirculation of air between the air conditioning apparatus 10 and the server room 20. In doing so, the controller 4 uses the coil 112 for cooling return air from the hot space 22, as it is taken in the first space 11, to produce cold air.

Further, for outdoor air lower in temperature than return air, so the outdoor air is available as cold air, for instance, the controller 14 operates to open the first damper 13a and the second damper 13b, and close the third damper 13c. That is, outdoor air is supplied as cold air to the cold spaces 21, and return air let out from the hot space 22 to the second space 12 is discharged outside the air conditioning apparatus 10. For low outdoor temperatures failing to meet the specified conditions, the controller 14 may operate for use of the coil 112, or for use of the humidifier 114, as necessary to cool or humidify outdoor air taken in the first space 11, respectively.

Further, as illustrated in FIG. 1, there may be a filter 115 installed in the first space 11, in position between a region common to the first damper 13a and the third damper 13c and a location of the humidifier 114. Provision of the filter 15 enables dust removal from outdoor air and return air.

Such being the case, the air conditioning system 1 is adapted to have cold air, as it is cooled by the coil 112 being an air conditioner, sent to the server room 20, and let out as return air from the server room 20, to again cool at the coil 112 for recirculation to the server room 20, or to discharge return air, taking in fresh outdoor air, supplying to the server room 20, for cooling computing machines accommodated in the racks 23, to retain in a normal state.

Such computing machines are supplied with electric power from a power supply 40, which is configured to receive services from a commercial power source and an uninterruptible power supply (UPS). That is, the power supply 40 normally makes use of power supplied from the commercial power source, but in an emergency such as interruption of power service from the power source, it makes use of power supplied from the UPS, affording to keep servers in the server room 20 free of shutdown even in the emergency.

On the other hand, at the air conditioning system 1, which has available service of power supplied from a commercial power source, there may be interruption of power service from the power source, as an emergency causing shutdown of operation also. With a service or services of power interrupted to the air conditioning system 1 like the above, the supply of cold air is to be interrupted, while the servers kept free of shutdown have their actions surviving with dissipation of heat. As heat dissipation is continued, there may be increased ambient air temperatures, with anxieties about potential problems in server action. The air conditioning system 1 might be adapted for use of a UPS service to have operations of air conditioning system 1 survive even after emergency, subject to necessary enlargements in scale of, among others, the air conditioning system 1 and UPS, constituting a difficulty to implement with ease.

Therefore, in the air conditioning system 1 according to the embodiment, the first damper 13a as well as the second damper 13b is provided with a mechanism for actuation to make it open in emergencies including a service or services of power interrupted to the air conditioning system 1. For instance, the first damper 13a has an actuation mechanism adapted for use of spring forces to make it open in emergencies including interruption of a service or services of power, allowing for an ensured opening to take outdoor air into the first space 11 in emergencies. Also the second damper 13b has a similar mechanism adapted for ensured actuation to make it open in emergencies including a service or services of power interrupted to the air conditioning system 1, affording to discharge return air in the second space 12, outside the air conditioning apparatus 10. Instead of the provision of particular mechanisms, there may be use of a state of the UPS supplying power to servers in an emergency, to provide a service of power to the dampers, to make them open in the emergency, in consideration of power consumption necessary for operation of the dampers to be small in comparison with power consumption for the entirety of air conditioning system 1 and the servers.

While servers are running, also fans 24 are rotating, producing streams of air from cold spaces 21 to the hot space 22. Therefore, even if the first air blower 111 is kept from blowing, the cold spaces 21 have reduced air pressures so long as fans 24 are rotating, so air in the first space 11 streams into the cold spaces 21. As air is streaming from the first space 11 to the cold spaces 21, the first space 11 has reduced air pressures, whereby outdoor air is caused to inflow through the first damper 13a to the first space 11.

Likewise, even if the second air blower 121 is kept from blowing, the hot space 22 has raised air pressures so long as fans 24 are rotating, so air in the hot space 12 streams, returning to the second space 12. As air is returning from the hot space 22 to the second space 12, the second space 12 has raised air pressures, whereby air is discharged through the second damper 13b, outside the air conditioning apparatus 10.

Such being the case, there may be an emergency such as an interruption of power service accompanied by functions of the air conditioning system 1 shut down with, among others, the first air blower 111 and the second air blower 121 being kept from blowing, where as long as fans 24 are rotating, there would be streams of air produced to a certain extent, though being weak as air streams compared with a situation in which the air blowers 111 and 121 are blowing. In anomalous occurrences, providing the first damper 13a and the second damper 13b are both open, it is possible to supply outdoor air as cold air to cold spaces 21, and discharge return air outside, affording to recirculate heated air between the air conditioning apparatus 10 and the server room 20, allowing for prevention of problems such as failures in performance of servers due to temperature rise.

It is noted that in the foregoing description, the first damper 13a and the second damper 13b have such mechanisms that make them open in emergencies including a service or services of power interrupted to the air conditioning system 1, while the third damper 13c may have such a mechanism that makes it close in emergencies. As the third damper 13c is operable to close in emergencies where the coil 112 is unable to serve for cooling, it is possible to avoid mixing heated return air from the second space 12 to the first space, thereby preventing high temperature air from being sent as cold air to cold spaces 21.

Past the power-interrupted situation, there comes a power-restored situation, where associated devices are generally operating as they were before interruption of power services thereto, while their states before the power interruption are not always still desirable as their states of operation in consideration of temperatures in the server room raised higher than usual.

To this point, at the air conditioning system 1 as restored to a situation supplied with power, the controller 14 operates for a prescribed interval of time to render the first damper 13a and the second damper 13b in their open states, and the third damper 13c in its close state, while driving the air blowers 111 and 121 and the coil 112 for cooperation to take in and cool outdoor air, without causing heated return air residing in the second space 12 to be mixed into the first space, to produce cold air, to supply to the server room, having heated return air from the server room discharged outside. This can prevent undue power consumption by use of the coil 112 for cooling heated return air to produce cold air.

Even for computing machines set in a server room and adapted to work with power supplied from a UPS in emergencies, air conditioning apparatuses in the past had no means for supplying power for application to, among others, cooling or recirculation of air, thus giving rise to increase in server room temperature, with anxieties about occurrences of failure at computing machines.

As will be seen from the foregoing, according to the embodiment, there is an air conditioning system adapted to work in emergencies such as power interruption, to control dampers, for use of streams of air produced by fans at servers or fans at server-accommodating racks, to make use of outside air as cold air, while having return air discharged outside, allowing for prevention of computing machine failures due to temperature rise by dissipation of heat in the enclosure.

While certain embodiment has been described, this embodiment has been presented by way of example only, and is not intended to limit the scope of inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An air conditioning apparatus connected to a server room configured with a cold space and a hot space separated from each other, including a server provided normally with a service of power from a commercial power source and in emergencies with a service of power from an uninterruptible power supply and disposed between the cold space and the hot space, to have cold air supplied through the cold space, heated by dissipation of heat at the server, and discharged as return air through the hot space, the air conditioning apparatus comprising:
    a first space connected to the cold space, and adapted to have cold air reside therein to send to the cold space;
    a second space adapted to have return air as discharged from the hot space reside therein;
    a first damper configured to have an opening adjusted under control of a controller to take in outdoor air to the first space, and adapted to have an open state in an emergency in which the server is supplied with power from the uninterruptible power supply;
    a second damper configured to have an opening adjusted under control of the controller to discharge return air in the second space, outside thereof, and adapted to have an open state in the emergency; and
    a third damper configured to have an opening adjusted under control of the controller to recirculate return air in the second space to the first space;
    wherein, in the emergency, the controller is configured to close the third damper and is further configured to keep the third damper closed after the emergency, when the supply of power from the uninterruptible power supply has ended.

2. An air conditioning system comprising an air conditioning apparatus connected to a server room configured with a set of cold spaces and a hot space separated from each other, including a set of servers provided normally with a service of power from a commercial power source and in emergencies with a service of power from an uninterruptible power supply and disposed between the set of cold spaces and the hot space, to have cold air supplied through cold spaces, heated by dissipation of heat at the servers, and discharged as return air through the hot space, and a controller configured to control the air conditioning apparatus, the air conditioning apparatus comprising:
    a first space connected to the set of cold spaces, and adapted to have cold air reside therein to send to the set of cold spaces;
    a second space adapted to have return air as discharged from the hot space reside therein;
    a first damper configured to have an opening adjusted under control of the controller to take in outdoor air to the first space, and adapted to have an open state in an emergency in which the servers are being supplied with power from the uninterruptible power supply;
    a second damper configured to have an opening adjusted under control of the controller to discharge return air in the second space, outside thereof, and adapted to have an open state in the emergency; and
    a third damper configured to have an opening adjusted under control of the controller to recirculate return air in the second space to the first space;
    wherein, in the emergency, the controller is configured to close the third damper and is further configured to keep the third damper closed after the emergency, when the supply of power from the uninterruptible power supply has ended.

3. An air conditioning system comprising an air conditioning apparatus connected to a server room configured with a set of cold spaces and a hot space separated from each other, including a set of servers provided normally with a service of power from a commercial power source and in emergencies with a service of power from an uninterruptible power supply and disposed between the set of cold spaces and the hot space, to have cold air supplied through cold spaces, heated by dissipation of heat at the servers, and discharged as return air through the hot space, and a controller configured to control the air conditioning apparatus, the air conditioning apparatus comprising:
    a first space connected to the set of cold spaces, and adapted to have cold air reside therein to send to the set of cold spaces;
    a second space adapted to have return air as discharged from the hot space reside therein;

a first damper configured to have an opening adjusted under control of the controller to take in outdoor air to the first space;

a second damper configured to have an opening adjusted under control of the controller to discharge return air in the second space, outside thereof;

a third damper configured to have an opening adjusted under control of the controller to recirculate return air in the second space to the first space;

a cooler operable to cool air in the first space; and air blowers operable to produce streams of air in the first space, a first cold space, a second cold space, and the second space, the controller being configured to:
    open the first and second dampers and close the third damper, in an emergency when power is supplied from the uninterruptable power supply to the server, and
    upon occurrence of an end of service of power from the uninterruptible power supply to the servers at an end of the emergency, to keep open the first and second dampers, keep the third damper closed, drive the cooler into an operating state, and drive the air blowers into operating states.

* * * * *